US007102911B2

(12) United States Patent
Hoffmann

(10) Patent No.: US 7,102,911 B2
(45) Date of Patent: Sep. 5, 2006

(54) METHOD FOR IMPROVING THE READ SIGNAL IN A MEMORY HAVING PASSIVE MEMORY ELEMENTS

(75) Inventor: Kurt Hoffmann, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 73 days.

(21) Appl. No.: 11/004,880

(22) Filed: Dec. 7, 2004

(65) Prior Publication Data

US 2005/0128796 A1    Jun. 16, 2005

(30) Foreign Application Priority Data

Dec. 11, 2003    (DE)    ................... 103 58 026

(51) Int. Cl.
*G11C 11/00* (2006.01)
(52) U.S. Cl. ................... 365/148; 365/189.07
(58) Field of Classification Search ........... 365/148, 365/189.07
See application file for complete search history.

(56) References Cited

U.S. PATENT DOCUMENTS 6,317,375 B1    11/2001    Perner
6,570,795 B1 *    5/2003    Fricke et al. ............... 365/200

* cited by examiner

*Primary Examiner*—Hoai V. Ho
(74) *Attorney, Agent, or Firm*—Edell, Shapiro & Finnan, LLC

(57) ABSTRACT

A method for improving read signals in a memory including passive memory elements provided at crossover locations of word and bit lines, and in which stored digital information is represented by a respective resistance of the memory elements includes: determining logic levels of information bits to be written to the memory elements associated with a respective bit line; inverting the logic levels of the information bits if more than half of information bits to be written to the memory elements associated with the respective bit line have a logic level corresponding to a low-value resistance of the memory elements; writing the information bits to the memory elements; and generating an additional check bit, a logic level of which represents an inverted or non-inverted state of the information bits.

11 Claims, 4 Drawing Sheets

METHOD FOR IMPROVING THE READ SIGNAL IN A MEMORY HAVING PASSIVE MEMORY ELEMENTS

CROSS REFERENCE TO RELATED APPLICATIONS

This application claims priority under 35 USC §119 to German Application No. DE 103 58 026.3, filed on Dec. 11, 2003, and entitled "Method for Improving the Read Signal in a Memory Having Passive Memory Elements," the entire contents of which are hereby incorporated by reference.

FIELD OF THE INVENTION

The invention relates to a method for improving the read signal in a memory having passive memory elements.

BACKGROUND

Memory devices of the aforementioned type are disclosed for example in "IEEE International Solid-State Circuits Conference, Digest of Technical Papers" pages 278 and 279, and also in U.S. Pat. No. 6,317,375, both documents being hereby incorporated by reference. The former document especially reveals that, in such a memory, at the crossover locations of word and bit lines that run perpendicular to one another in rows and columns, passive memory elements are provided between the lines. These memory elements may comprise for example polymers, chalcogenites or magnetoresistive materials.

In the case of memory devices having polymers as memory elements, the memory effect is based on polar conducting polymer molecules. In this case, data is stored as permanent polarization that is generated by application of electric fields. The resistance of the memory element depends on the polarization orientation of the polymer molecules.

In the case of memory devices having magnetoresistive (ferromagnetic) materials as memory elements, the resistance depends on the orientation and magnitude of the spin polarization of the ferromagnetic materials.

A large or small resistance results depending on the orientation and magnitude of the polarization in the materials mentioned above. These resistances may in each case be assigned a digital logic level. Thus, a large resistance may correspond to a logic "1" and a small resistance may correspond to a logic "0".

FIG. 1 of the drawings shows a detail from a memory 10 having memory elements 12, which are illustrated at resistors for the sake of simplicity. These memory elements are situated at crossover locations of word lines ..., WLk−1, WLk, WLk+1, ... and bit lines ..., BLi−1, BLi, BLi+1, .... These memory elements 12 shall be programmed in the sense described above, so that they have either a large resistance corresponding to a logic "1" or a comparatively small resistance corresponding to a logic "0".

By way of example, the memory element 12 with a black backing in FIG. 1 is now intended to be read, the memory element being situated on the bit line BLi and the read line WLk. For this purpose, a measurement voltage UMeas of 1 V may be applied to the bit line BLi at a terminal 14 and a voltage of 0V may be applied to the read line WLk, while a voltage of 1 V is present on all the other word lines ..., WLk−1, WLk+1, ..... In the ideal case, a measurement current IMeas then flows only via the memory element 12 with a black backing, the measurement current being indicated on an ammeter 16. The value of this measurement current IMeas depends on the resistance of the memory element 12 and represents either a logic "1" equal to a large resistance or a logic "0" to a small resistance.

In practice, however, this ideal case is not afforded since a parasitic current also flows via all the other memory elements 12 situated on the bit line BLi if the voltage at the terminal 14 has a value that deviates from UMeas=1 V.

FIGS. 2A and 2B show a possible realization for reading out information by means of a differential amplifier 20 having relative feedback via a resistor RS, the negative input of the amplifier being connected to the terminal 14 of the bit line BLi and the measurement voltage UMeas being present at the negative input of said amplifier. Given the voltages specified in FIG. 1, however, a voltage Ux that differs from 0 is present, rather than the voltage 0, in the practical case. An output signal U0 of the differential amplifier 20 represents the read signal.

In accordance with FIG. 2B, an equivalent resistance RP shall be the resulting resistance of all the memory elements 12 that are not to be read on the bit line BLi. A parasitic current flows via said equivalent resistance RP, the value of said current depending on the logic state of all the memory elements 12 that are not to be read on the bit line BLi.

An explanation shall be given firstly of the state in which the memory element 12 to be read contains a logic "0", which shall correspond to a resistance of, for example, 103 ohms. If all further memory elements 12 not to be read on the bit line BLi contained a logic "1", then that would correspond to a resistance of e.g., 1 Mohm. Given 1000 cells that are not to be read on the bit line BLi, for example, then for this case the parasitic resistance RP would be equal to 1 Mohm/1000 which equals 1 kohm.

On the other hand, if all the memory elements 12 that are not to be read and are situated on the bit line BLi contained a logic "0" with a resistance of 103 ohms, then given 1000 memory elements 12 that are not to be read, the result would be a parasitic resistance RP of 103 ohms/1000 which equals 1 ohm.

Corresponding conditions result if the memory element 12 to be read contains a logic 1, limit values for the parasitic resistance RP of 1 kohm and 1 ohm likewise resulting.

The parasitic current flowing via the parasitic resistance RP thus fluctuates greatly in a manner dependent on the logic levels in the memory elements 12 that are not to be read on the bit line BLi, which leads to corresponding fluctuations in the voltage Ux at the input of the differential amplifier 20. The read signal U0 at the output of the differential amplifier 20 fluctuates correspondingly.

The diagram according to FIG. 3, illustrating the output voltage U0 of the differential amplifier 20 over time, shows a range 30 of output voltages U0 for a read-out "0" and a range 31 of output voltages U0 for a read-out "1". An upper voltage value 30-1 of the voltage range 30 represents the case in which the memory element 12 that is read is surrounded by all logic levels "1", while a lower voltage value 30-2 represents the case in which the memory element 12 that is read is surrounded by all logic levels "0". Correspondingly, an upper value 31-1 of the voltage range 31 represents the case in which the memory element 12 that is read is surrounded by all logic levels 1, while a lower voltage value 31-2 represents the case in which the memory element 12 that is read is surrounded by all logic levels "0". The respective intermediate voltage values of the voltage ranges 30 and 31 represent cases in which the memory element 12 that is read is surrounded both by logic levels "1" and by logic levels "0".

A range 32 between the ranges 30 and 31 represents the signal-to-noise voltage ratio at the input of the differential amplifier 20.

A possible improvement in the situation explained above constitutes for example allocating a fixed voltage to non-selected bit and word lines. This results in an improved evaluation of the read signal, but two switches and thus additional layout space are required at each word and bit line.

A further possibility for the configuration of a memory is described "IEEE International Solid-State Circuits Conference, Digest of Technical Papers", as mentioned in the introduction. In this case, reading is effected in two steps, a first step determining the memory element current through the selected memory element as a result of the parasitic current and a second step determining a known current of a previously written "0" flowing via a reference cell plus the same parasitic current. The current determined in the second step is subtracted from the total current determined in the first step, so that only the current through the memory cell that is read is measured relative to the reference current. However, this requires, on each word and bit line, an additional decoder in the memory, with the result that the latter does not manage without active components.

SUMMARY

The present invention is based on the object of specifying a memory of the type under discussion which manages without active components for reading out information.

In the case of a method of the type mentioned in the introduction, this object is achieved according to the invention by virtue of the fact that in the event of writing information to the memory elements a check is made to determine whether more than half of the information bits on a respective bit line of a logic level corresponding to a low-value resistance of the memory elements, for this case, at all the memory elements of the respective bit line, the logic levels of the information bits being inverted and an additional check bit being generated, the respective logic level of which represents the inverted or noninverted state of the information bits.

The embodiment of the present invention solves the problem of the very low signal-to-noise voltage ratio during reading by virtue of the fact that at least half of all the memory elements always contain an information bit corresponding to the high-value resistance. Thus, the parasitic resistance RP in accordance with FIGS. 2A and 2B assumes a high-value resistance.

If information bits were inverted in the event of writing information to the memory, then they are inverted back in the event of read-out.

Specifically, in accordance with one embodiment of the invention, a logic is provided such that the low-value resistance of the memory elements corresponds to a logic "0" and the high-value resistance corresponds to a logic "1".

In accordance with an additional embodiment of the invention, in the event of writing information with a number of information bits identical to the number of memory elements on a respective bit line, the respective number of information bits having a logic level corresponding to the high-value or low-value resistance of the memory elements is determined separately, the check bit is set with a logic level corresponding to the inverted or noninverted logic level of the information bits, and the information bits are fed sequentially into the memory elements of the respective bit lines.

In a development of the invention, the number of information bits having a logic level corresponding to the high-value or low-value resistance of the memory elements is determined by counting. In this case, in particular, half of the information bits corresponding to the number of memory elements on the respective bit line are counted.

In accordance with another configuration of the invention, the number of information bits having a logic level corresponding to the high-value or low-value resistance of the memory elements is determined by analog weighting. This weighting of the information bits may be effected by comparing their logic level with a reference voltage.

In the event of reading out information, firstly the check bit and then the information bits are read out from the respective memory elements.

In accordance with a further embodiment of the invention, it is provided that, in the event of writing information with a number of information bits that is smaller than the number of memory elements on a respective bit line, the memory elements are divided into groups in which the number of memory elements is equal to the number of information bits, each group of memory elements is assigned a check bit, the information bits are written to a group of memory elements in inverted or noninverted form and information bits having a logic level corresponding to the high-value resistance are written to the remaining groups of memory elements.

If the invention is to write information to an individual memory element on a bit line, then, in accordance with a further feature of the invention, all the memory elements or a group of memory elements on the bit line are read, the associated check bit is generated therefrom, then the information is written to the memory element and the check bit is generated anew.

The above and still further aspects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below on the basis of exemplary embodiments in accordance with the figures of the drawing, in which.

DETAILED DESCRIPTION

As already explained, an embodiment of the present invention involves solving the problem of very low signal-to-noise voltage ratio in the event of reading from memory devices having passive memory elements by virtue of the fact that at least half of the memory cells contain an information bit corresponding to the high-resistance state of the memory cells, specifically a logic "1". In this case, in the event of writing information, care is taken to ensure that the logic level "1" is written to at least half of all the memory elements on a respective bit line. This is done by checking by means of counting or analog weighting to determine whether more than half of all the information contents in the memory elements on a respective bit line have the logic level "0". If this is that case, then, on all the memory elements of this bit line, all the logic levels "0" are converted into a logic level "1" and all the logic levels "1" are converted into a logic level "0". This merely requires a single additional check bit on each bit line which is used to identify whether the content of the memory elements on this bit line is inverted or not inverted. If fewer than half of all the information contents in the memory elements on a bit line are equal to the logic level "0", then the information contents remain unchanged and a check bit with the logic level "0" is generated and stored, while in the other case a check bit with the logic level "1" is generated and stored.

This additional check bit with the logic level "1" or "0" makes it clear in the event of reading from the memory whether the information contents in the memory elements on a selected bit line were inverted or remained non-inverted during writing.

Figure 2A:
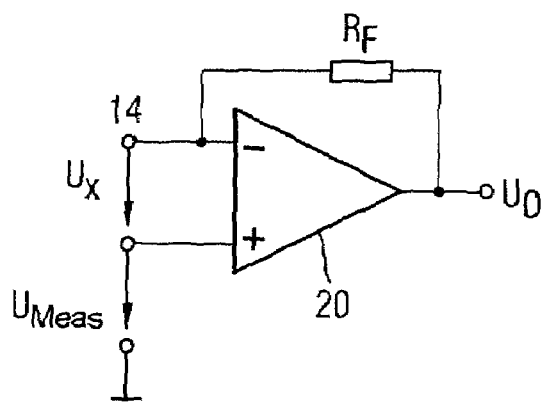
Figure 2B:
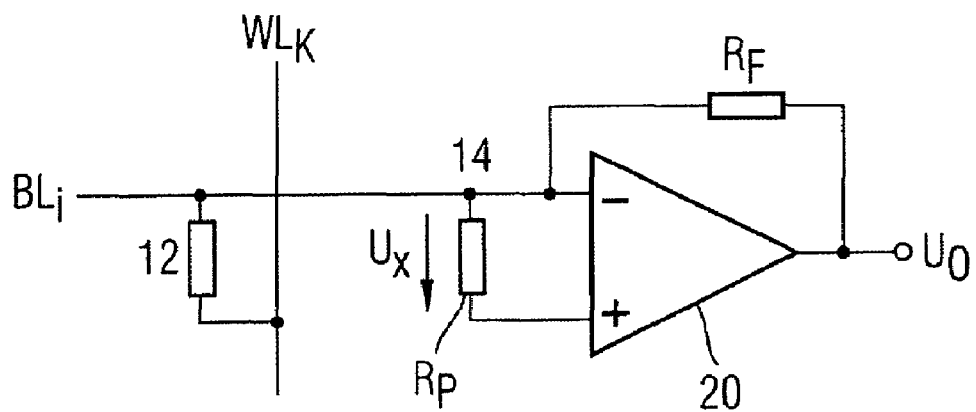
Figure 3:
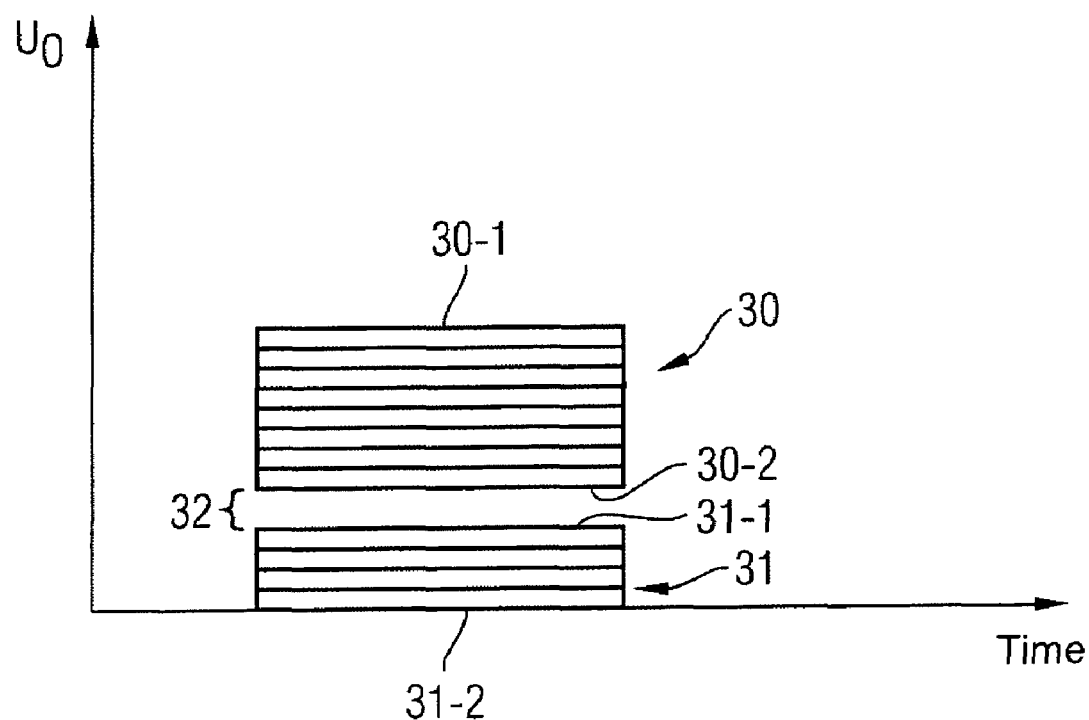

The advantage of the method according to the invention resides in the fact that in this case the signal-to-noise voltage ratio, that is to say the distance between the worst test "0" and "1" signal (see FIG. 3), depending on the number of memory elements on a bit line, is considerably improved since the parasitic current via the parasitic resistance RP in accordance with FIG. 2B of the non-selected memory elements is correspondingly large. The influence of the parasitic current of the other non-selected memory elements on the selected bit line is thereby considerably reduced and the difference in the read voltage between a "0" and a "1" signal is considerably increased.

Figure 1:
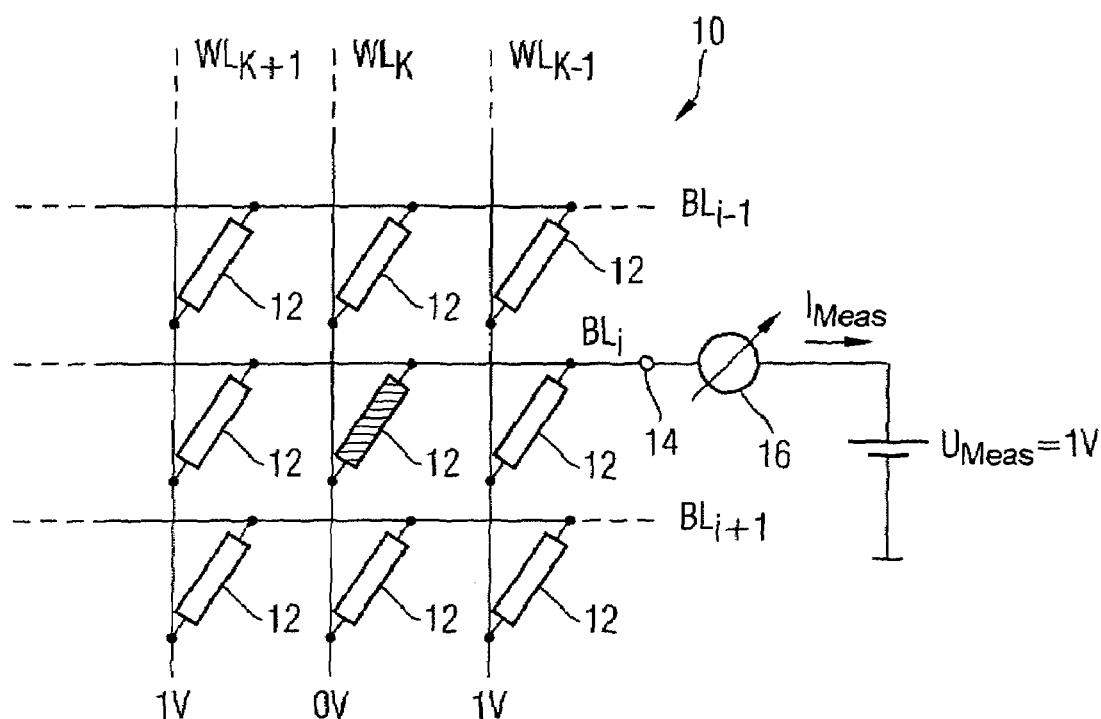
FIGS. 1A, 2A, 2B and 3 show the fundamental illustrations for elucidating the problem area of read-out in the case of memory devices having passive memory elements.
Figure 4:
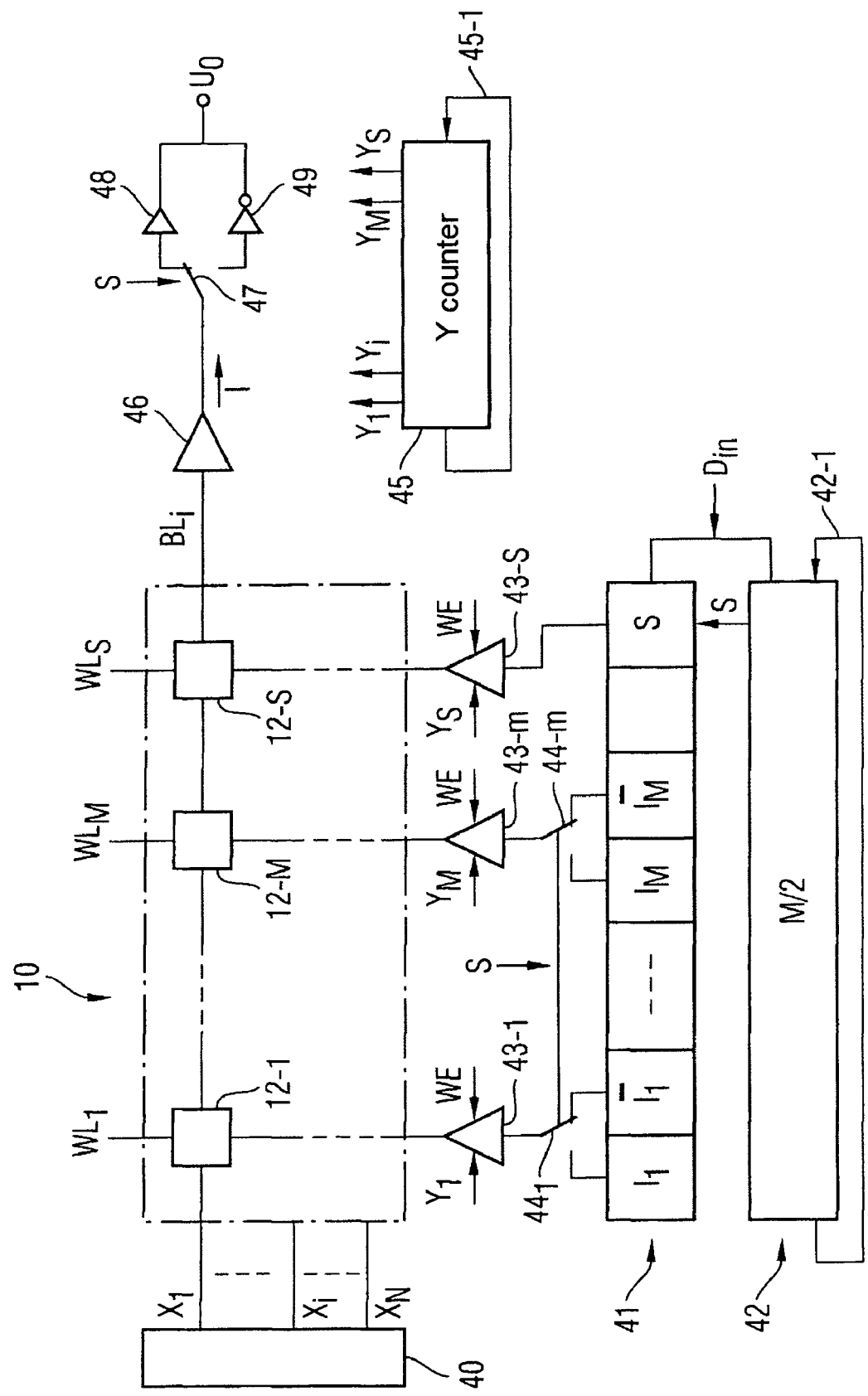
FIG. 4 shows an exemplary embodiment in which information having a number of information bits that is identical to the number of memory elements on a respective bit line is written in and read out.

In the case of the exemplary embodiment according to FIG. 4, provision is made of a memory 10 corresponding to the memory according to FIG. 1 having memory elements 12-1, . . . , 12-M and 12-S on a bit line BLi and on word lines WL1, . . . , WLM, WLS. In this case, then, FIG. 4 shows only three memory elements 12-1, . . . , 12-M, 12-S on the word and bit lines mentioned, but this configuration is continued both in the row direction and in the column direction. Generally, M=1, 2, 3, . . . is provided in the row direction and N=1, 2, 3, . . . is provided in the column direction, a respective memory element for a check bit S being added. A memory having M×N information memory elements and N memory elements for a respective check bit S is thus involved. The bit line BLi is a selected bit line with respect to which a selected word line is added for reading from a memory element.

The bit lines are selected by means of a bit line decoder 40, which supplies output signals X1, . . . , Xi, XN as selection signals.

Information Din to be stored is input both into an input register 41 and into a counter 42 which can be reset via an input 42-1.

The input register contains the logic information levels I1, I1, . . . , IM, IM and the check bit S. The counter 42 counts the incoming logic levels "0". If the number thereof is greater than M/2, then the check bit S is set to the logic level "1" and written to the register 41. In the other case, the check bit S requires the logic level "0".

The content of the input register 41 is fed via switches 44-1, . . . , 44-M in the amplifier 43-1, . . . , 43-M and via the latter into the word lines WL1, . . . WLM and thus into the memory elements 12-1, . . . , 12-M. The check bit S is stored via an amplifier 43-S into the associated word line WLS and thus into the memory element 12-S. The amplifiers 43-1, . . . , 43-M, 43-S are enabled by a write enable signal WE and are coupled sequentially to the word lines WL1, . . . , WLM, WLS by selection signals Y1, . . . , YM, YS from a Y counter 44, as a result of which the corresponding memory elements 121, . . . , 12M, 12S are selected.

The contents in the input register 41 are thus written to the memory elements on the corresponding bit line BLi, in which case they are inverted or not inverted in accordance with the set check bit S.

The reading of information from the memory 10 is effected in the manner already explained with reference to FIGS. 2A and 2B, via an amplifier 46, at the output of which the information I is fed into a noninverting amplifier 48 or inverting amplifier 49 via switch 47 set by the check bit S. The read signal U0 is then present at the output of the amplifiers 48 and 49, as has already been explained with reference to FIGS. 2A and 2B. Thus, by means of circuit configuration 46 to 49, the information is output in non-inverted or inverted-back fashion depending on the position of the switch 47.

Figure 5:
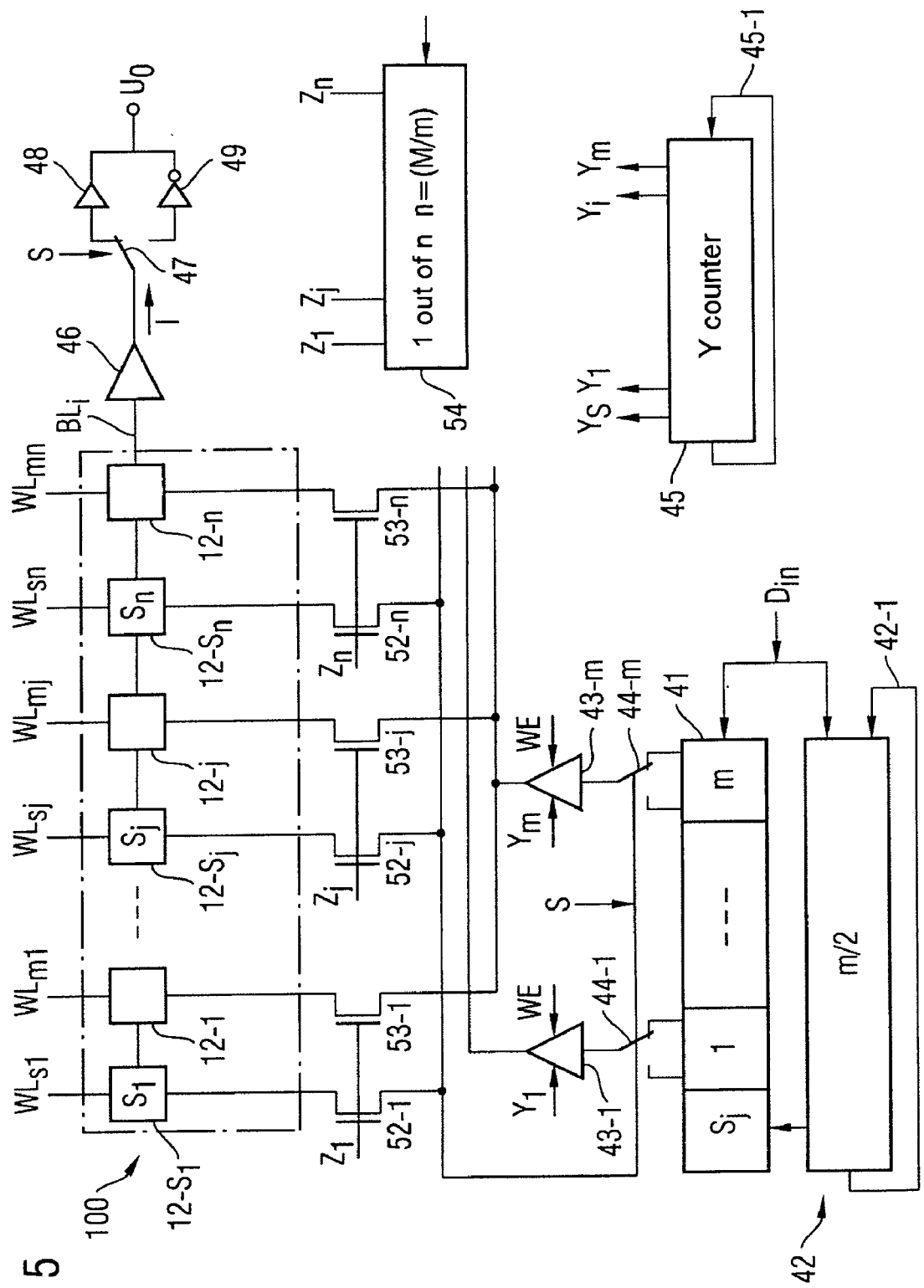
FIG. 5 shows an exemplary embodiment in which information having a number of information bits that is less than the number of memory elements on a respective bit line is written in and read out.

FIG. 5, in which elements identical to those in FIG. 4 are provided with the same reference symbols, shows a further exemplary embodiment of the invention, which involves as it were a multiplication of the exemplary embodiment according to FIG. 4. Although FIG. 5 illustrates in each case only one information memory element 12-1, . . . , 12-$j$, . . . , 12-$n$ and also one check bit memory element 12-S1, . . . , 12-Sj, . . . , 12-Sn. In the memory 100 each memory element pair 12-1, 12-S1 and so on may be interpreted as a memory array as has been explained on the basis of the memory array 10 according to FIG. 4. Writing is then effected in each case only to a memory array m on a bit line BLi with a total of M memory elements, in which case the number of memory elements per memory array m=M/n where n=2, 3, . . . . The parallel writing of m=64 or m=128 per system Bus line to a memory shall be mentioned as an example. For each of these n memory arrays on a bit line BLi, it is then necessary in each case to apply an additional check bit Sj since the inversion now relates only to the respective memory array having m memory elements. In this case, the counter 42 only has to count up to m/2=M/2n before it sets the check bit Sj.

The functional sequence is then as follows:

With the write enable signal WE, the memory is switched to information writing. The selected bit line address—not illustrated in FIG. 5—remains constant throughout the writing operation. The m/2 counter 42 is set to 0 with the reset signal 42-1. The information content Din to be written is written to the register 41 and to the counter 42. The check bit Sj is set in accordance with the number of logic levels "0" in the input information Din and written to the register 42 as an additional bit. If the number of logic levels "0" is greater than m/2, the check bit Sj is set to the logic level "1" and written to the register 42 as an additional bit. Otherwise, the check bit Sj is set to the logic level "0". All further m-th contents in the register are written to m memory elements on the bit line BLi in accordance with an associated word line address Zj via a Zj decoder. The set check bit Sj defines whether the written content is inverted or not inverted.

Depending on the type of memory, the writing may be effected, for example in the case of a memory having magnetoresistive memory elements, in parallel by simultaneous setting of all the signals Yi or, for example in the case of a polymer memory, serially via the counter 45.

The writing explained above may be effected n times on a bit line BLi in memory arrays having M memory elements. Each of these m memory arrays requires a dedicated check bit S1 and so on.

It should be pointed out that, if writing to an individual memory array m is effected, for the first time a logic level 1 is written to all the other memory arrays of the memory 100.

The memory elements on a bit line that are associated with a memory array m are read in a manner known per se by means of the selection signals Zj and Yi. In this case, it is always necessary firstly to read the check bit Sj associated with the selected memory array m before the remaining memory elements of the memory array m can be read since the latter may still have to be inverted in accordance with the check bit Sj.

In accordance with a further exemplary embodiment of the invention, random writing to an individual memory element on a bit line is also possible. In this case, however, it is always necessary first to read all the memory elements on a bit line or a memory array m comprising the memory elements on the selected bit line and to effect reading again into the input register 41 and the counter 42 for generation of the check bit S before the new information Din can be written to the selected memory element or the memory array m and the check bit S can be correspondingly set anew. The information is then read as in the case of the exemplary embodiments according to FIGS. 4 and 5.

Having described preferred embodiments of a new and improved method for improving the read signal in a memory device having passive elements, it is believed that other modifications, variations and changes will be suggested to those skilled in the art in view of teachings set forth herein. It is therefore to be understood that all such variations, modifications an changes are believed to fall within the scope of the present invention as defined by the appended claims. Although specific terms are employed herein, they are used in generic and descriptive sense only and not for purposes of limitation.

| List of reference symbols | |
|---|---|
| 10, 100 | Memory |
| 12, 12-1, 12-j, 12-M, 12-n, 12-S, 12-$S_l$, 12-$S_j$, 12-$S_n$ | Memory element |
| 14 | Amplifier input |
| 20 | Differential amplifier |
| $D_F$ | Feedback resistor |
| $R_P$ | Parasitic resistance |
| $U_{Meas}$ | Measurement voltage |
| $U_X$ | Input voltage |
| $U_O$ | Output voltage |
| 30 | Output voltage range for logic "0" |
| 30-1, 30-2 | Output voltage limit value |
| 31 | Output voltage range for logic "1" |
| 31-1, 31-2 | Output voltage limit value |
| 32 | Signal-to-nose voltage ratio |
| $WL_1$, $WL_M$, $WL_S$, $WL_{S1}$, $WL_{m1}$, $WL_{sj}$, $WL_{mj}$, $WL_{sn}$, $WL_{mn}$ | Word line |
| $BL_{i-1}$, $BL_i$, $BL_{i+1}$ | Bit line |
| 40 | Decoder |
| $X_1$, $X_i$, $X_N$ | Decoder output signal |
| 41 | Input controller |
| $I_1$, $I_1$, $I_M$, $I_M$, S, $S_j$, 1, m | Input register content |
| 42 | Information bit counter |
| 42-1 | Reset signal |
| S | Check bit |
| 43-1, 43-M, 43-S | Amplifier |
| 44-1, 44-M, 44-m | Switch |
| WE | Write enable signal |
| 45 | Y counter |
| 45-1 | Reset signal |
| $Y_1$, $Y_i$, $Y_M$, $Y_S$ | Counter output signal |
| 46 | Amplifier |
| 47 | Switch |
| 48 | Noninverting amplifier |
| 49 | Inverting amplifier |
| I | Information read out |
| 54 | Counter |
| $Z_1$, $Z_j$, $Z_n$ | Counter output signal |
| 52-1, 53-1, 52-j, 53-j, 52-n, 53-n | Selection transistor |
| $D_{in}$ | Input information |

What is claimed is:

1. A method for improving read signals in a memory comprising passive memory elements provided at crossover locations of word and bit lines, and in which stored digital information is represented by a respective resistance of the memory elements, the method comprising:

determining logic levels of information bits to be written to the memory elements associated with a respective bit line;

inverting the logic levels of the information bits if more than half of information bits to be written to the memory elements associated with the respective bit line have a logic level corresponding to a low-value resistance of the memory elements;

writing the information bits to the memory elements; and generating an additional check bit, a logic level of which represents an inverted or non-inverted state of the information bits.

2. The method as claimed in claim 1, wherein information bits stored in an inverted state are inverted back to a non-inverted state when the information bits are to be read from the memory.

3. The method as claimed in claim 1, wherein the low-value resistance of the memory elements corresponds to logic level "0" and the high-value resistance corresponds to logic level "1".

4. The method as claimed in claim 1, wherein, in the event of writing information with a number of information bits identical to the number of memory elements on a respective bit line, the method further comprises:

determining separately the respective number of the information bits having a logic level corresponding to a high-value or the low-value resistance of the memory elements;

setting a check bit with the logic level corresponding to the inverted or non-inverted logic level of the information bits; and feeding the information bits sequentially into the memory elements of the respective bit lines.

5. The method as claimed in claim 1, wherein the number of information bits having a logic level corresponding to the high-value or the low-value resistance of the memory elements is determined by counting.

6. The method as claimed in claim 5, wherein half of the information bits corresponding to the number of memory elements on the respective bit line are counted.

7. The method as claimed in claim 4, wherein the number of information bits having a logic level corresponding to the high-value or low-value resistance of the memory elements is determined by analog weighting.

8. The method as claimed in claim 7, wherein the information bits are weighted by comparing their logic level with a reference voltage.

9. The method as claimed in claim 2, wherein the check bit is read out prior to the information bits.

10. The method as claimed in claim 1, wherein in the event of writing information with a number of information bits that is smaller than the number of memory elements on the respective bit line, the method further comprises:

dividing the memory elements into groups in which the number of memory elements is equal to the number of information bits;

assigning each group of memory elements a check bit memory element;

writing the information bits to a group of memory elements in the inverted or non-inverted state; and writing information bits having the logic level corresponding to the high-value resistance to remaining groups of the memory elements.

11. The method as claimed in claim 1, wherein, for random writing of information to an individual memory element on a bit line, the method further comprises:

reading all the memory elements or a group of memory elements on the bit line;

generating an associated check bit from the memory elements read; and writing the information to the memory element with the generated check bit.

* * * * *